United States Patent
Han et al.

(10) Patent No.: US 11,469,272 B2
(45) Date of Patent: Oct. 11, 2022

(54) NONVOLATILE MEMORY DEVICE HAVING RESISTANCE CHANGE MEMORY LAYER

(71) Applicant: SK hynix Inc., Icheon-si (KR)

(72) Inventors: Jae Hyun Han, Icheon-si (KR); Hyangkeun Yoo, Seongnam-si (KR); Se Ho Lee, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 273 days.

(21) Appl. No.: 16/844,806

(22) Filed: Apr. 9, 2020

(65) Prior Publication Data

US 2021/0074763 A1    Mar. 11, 2021

(30) Foreign Application Priority Data

Sep. 6, 2019    (KR) .................. 10-2019-0111072

(51) Int. Cl.
*H01L 27/24* (2006.01)
*H01L 45/00* (2006.01)
*H01L 29/24* (2006.01)

(52) U.S. Cl.
CPC ........ *H01L 27/249* (2013.01); *H01L 27/2454* (2013.01); *H01L 29/24* (2013.01); *H01L 45/08* (2013.01); *H01L 45/146* (2013.01)

(58) Field of Classification Search
CPC ... H01L 27/249; H01L 27/2454; H01L 29/24; H01L 45/08; H01L 45/146; H01L 27/2436; H01L 45/1226; H01L 27/2481; H01L 27/24; H01L 45/12; H01L 45/16
See application file for complete search history.

(56) References Cited

U.S. PATENT DOCUMENTS

| 9,691,819 B2 | 6/2017 | Oh et al. |
| 9,859,338 B2 | 1/2018 | Chen et al. |
| 2020/0075625 A1* | 3/2020 | Kobayashi ........ H01L 27/11582 |

\* cited by examiner

*Primary Examiner* — David Vu

(57) ABSTRACT

A nonvolatile memory device according to an embodiment includes a substrate, a gate electrode structure disposed on the substrate, a gate dielectric layer covering at least a portion of a sidewall surface of the gate electrode structure on the substrate, a channel layer and a resistance change structure that are sequentially disposed on the gate dielectric layer, and a plurality of bit line structures disposed inside the resistance change structure.

20 Claims, 12 Drawing Sheets

NONVOLATILE MEMORY DEVICE HAVING RESISTANCE CHANGE MEMORY LAYER

CROSS-REFERENCE TO RELATED APPLICATION

The present application claims priority under 35 U.S.C. § 119(a) to Korean Patent Application No. 10-2019-0111072, filed on Sep. 6, 2019, which is herein incorporated by reference in its entirety.

BACKGROUND

1. Technical Field

The present disclosure relates generally to a nonvolatile memory device and, more particularly, to a nonvolatile memory device having a resistance change memory layer.

2. Related Art

As the design rule decreases and the degree of integration increases, research has continued on the structures of semiconductor devices that can guarantee both structural stability and operational reliability. Currently, as a charge storage structure, a nonvolatile memory device, such as a flash memory that employs a three-layer stacked structure including a charge tunneling layer, a charge trap layer, and a charge barrier layer, has been widely utilized.

Recently, various nonvolatile memory devices having different structures from existing flash memories have been proposed. An example of a nonvolatile memory device is a resistance change memory device. While a flash memory implements a memory function through charge storage, a resistance change memory device may write predetermined signal information in the memory cell by varying resistance of a memory layer, between a high resistance and a low resistance, and storing the changed resistance in a nonvolatile manner.

SUMMARY

A nonvolatile memory device according to an embodiment of the present disclosure includes a substrate, a gate electrode structure disposed on the substrate, a gate dielectric layer covering at least a portion of a sidewall surface of the gate electrode structure on the substrate, a channel layer and a resistance change structure that are sequentially disposed on the gate dielectric layer, and a plurality of bit line structures disposed within the resistance change structure.

A nonvolatile memory device according to an embodiment of the present disclosure includes a substrate, a pair of gate electrode structures disposed to be spaced apart from each other on the substrate, a gate dielectric layer and a channel layer that are sequentially disposed on a sidewall surface of each of the pair of gate electrode structures, a resistance change structure disposed between the pair of gate electrode structures on the substrate and disposed to contact the pair of channel layers, and a plurality of bit line structures extending in the first direction within the resistance change structure.

DETAILED DESCRIPTION

Figure 1:
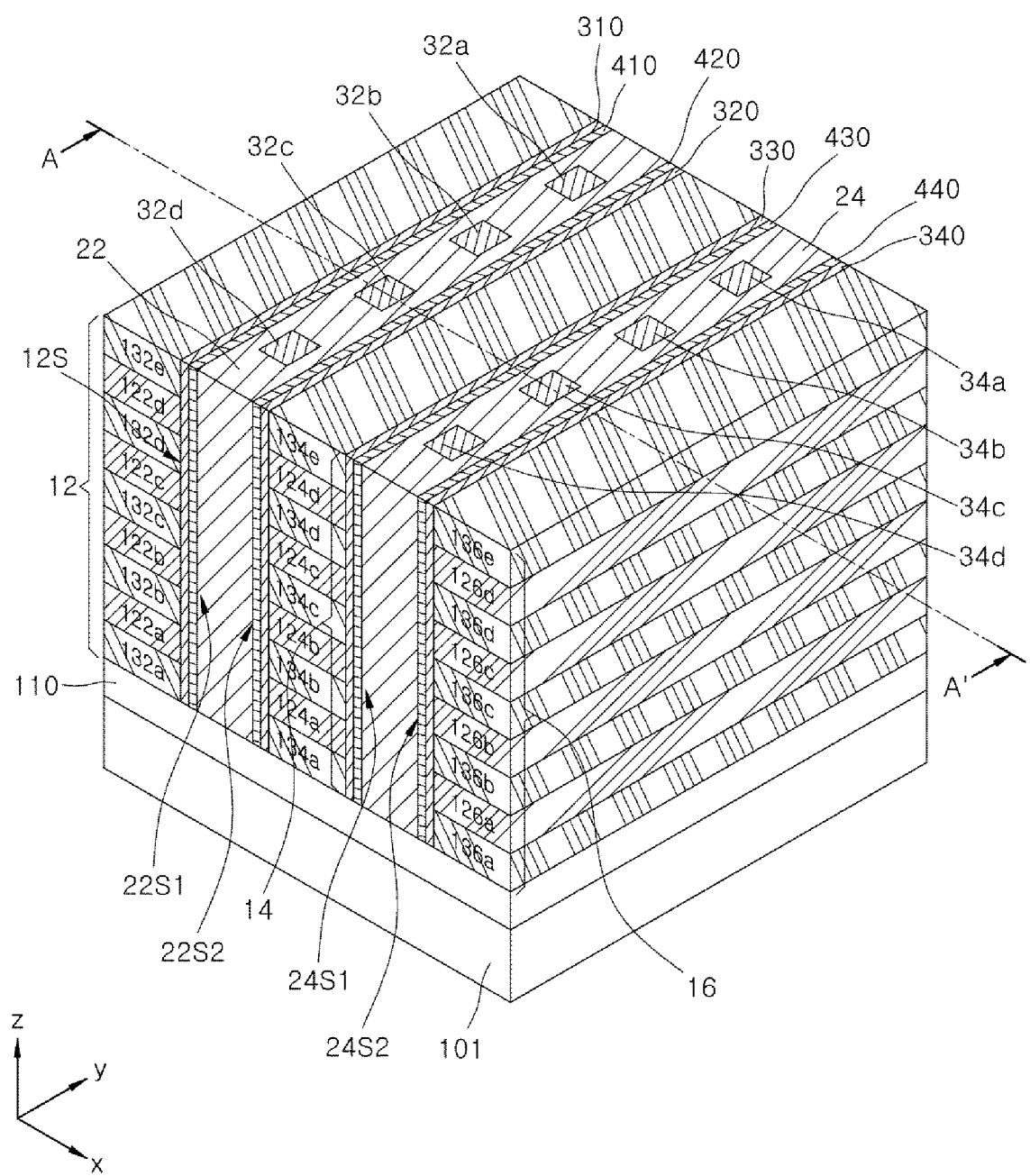
FIG. 1 is a perspective view schematically illustrating a nonvolatile memory device according to an embodiment of the present disclosure.

Various embodiments will now be described hereinafter with reference to the accompanying drawings. In the drawings, the dimensions of layers and regions may be exaggerated for clarity of illustration. As a whole, the drawings are described from an observer's viewpoint. If an element is referred to be located "on" or "under" another element, it may be understood that the element is directly located "on" or "under" the other element, or an additional element may be interposed between the element and the other element. The same reference numerals in the drawings refer to substantially the same elements as each other.

The terms used herein may correspond to words selected in consideration of their functions in the embodiments, and the meanings of the terms may be construed to be different according to the ordinary skill in the art to which the embodiments belong. If expressly defined in detail, the terms may be construed according to the definitions. Unless otherwise defined, the terms (including technical and scientific terms) used herein have the same meaning as commonly understood by one of ordinary skill in the art to which the embodiments belong.

In addition, expression of a singular form of a word should be understood to include the plural forms of the word unless clearly used otherwise in the context. It will be understood that the terms "comprise" or "have" are intended to specify the presence of a feature, a number, a step, an operation, an element, a component, a part, or combinations thereof, but not used to preclude the presence or possibility of addition one or more other features, numbers, steps, operations, elements, components, parts, or combinations thereof.

Herein, the x-direction means a direction parallel to the x-axis in the x-y-z coordinate system. Similarly, the y-direction means a direction parallel to the y-axis in the x-y-z coordinate system, and the z-direction means a direction parallel to the z-axis in the x-y-z coordinate system._

Figure 2:
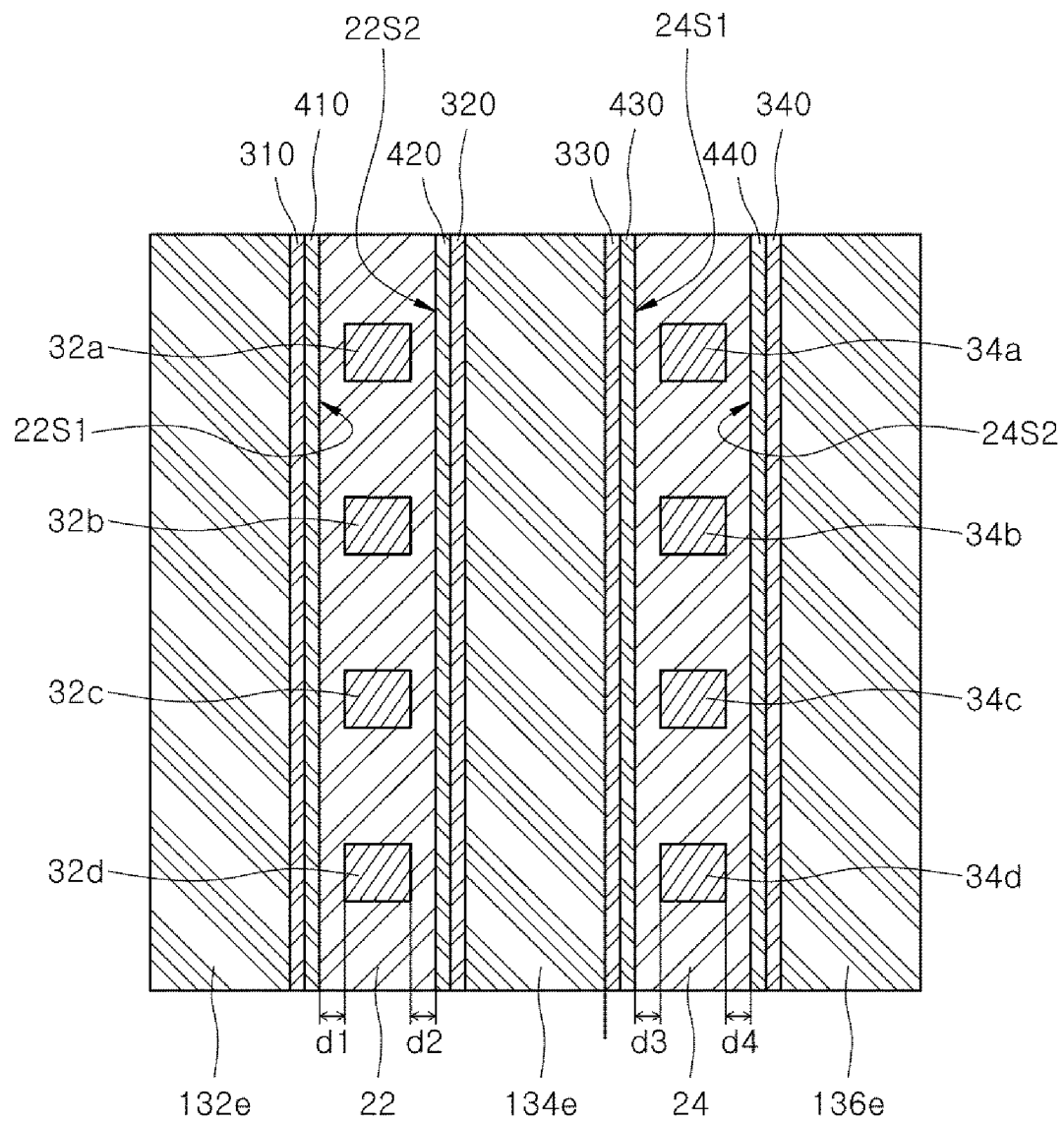
FIG. 2 is a plan view of the nonvolatile memory device of FIG. 1.
Figure 3:
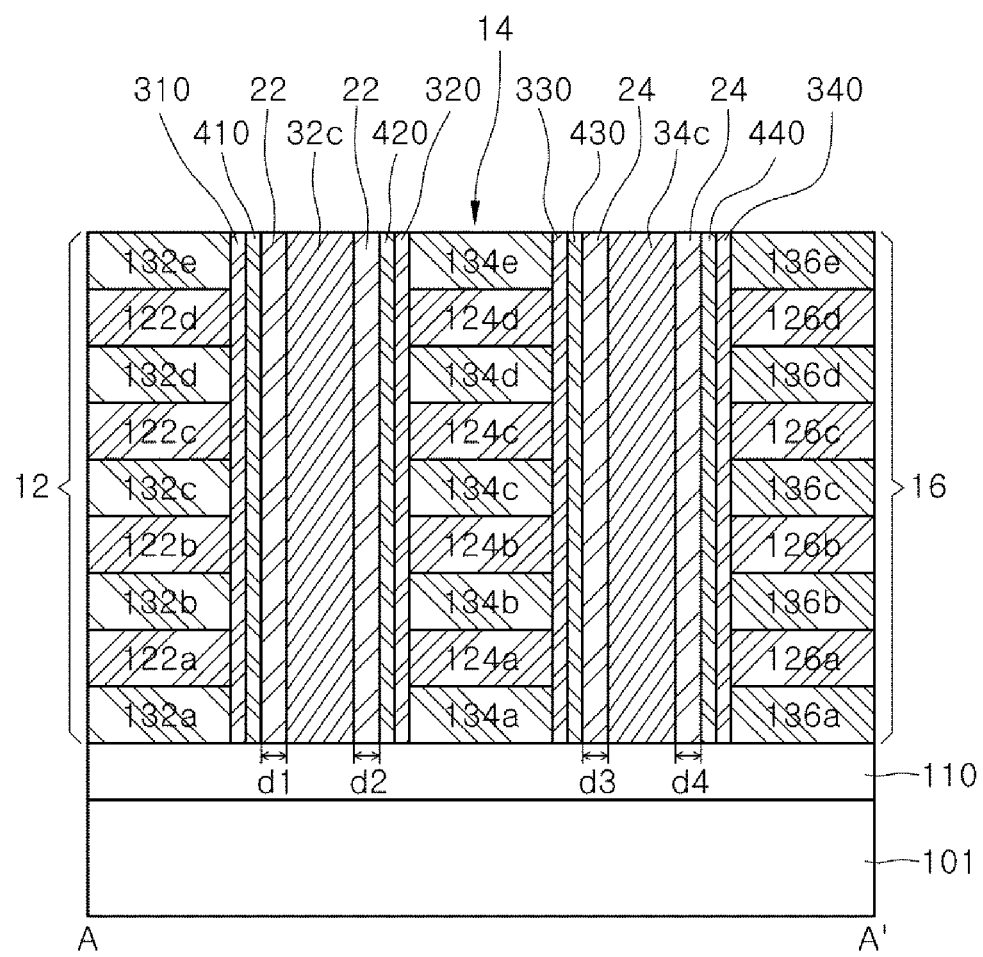
FIG. 3 is a cross-sectional view taken along the line A-A' of the nonvolatile memory device of FIG. 1.

FIG. 1 is a perspective view schematically illustrating a nonvolatile memory device according to an embodiment of the present disclosure. FIG. 2 is a plan view of the nonvolatile memory device of FIG. 1. FIG. 3 is a cross-sectional view taken along the line A-A' of the nonvolatile memory device of FIG. 1.

Referring to FIGS. 1 to 3, a nonvolatile memory device 1 may include a substrate 101, first to third gate electrode structures 12, 14 and 16, and first to fourth gate dielectric layers 310, 320, 330 and 340, each disposed substantially in the y-z plane adjacent to a sidewall surface among the first to third gate electrode structures 12, 14 and 16. The nonvolatile memory device 1 may include first to fourth channel layers 410, 420, 430 and 440 disposed on the first to fourth gate dielectric layers 310, 320, 330 and 340, respectively, and first and second resistance change structures 22 and 24 disposed between the first to second channel layers 410 and 420, and between the third to fourth channel layers 430 and 440, respectively. The nonvolatile memory device 1 may include first to eighth bit line structures 32a, 32b, 32c, 32d; 34a, 34b, 34c and 34d disposed inside the first and second resistance change structures 22 and 24, respectively.

The substrate 101 may include a semiconductor material. Specifically, the semiconductor material may include silicon (Si), germanium (Ge), gallium arsenide (GaAs), indium phosphide (InP), or silicon germanium (SiGe), or the like. The substrate 101 may be doped with an n-type or p-type dopant. As an example, the substrate 101 may include a well region doped with an n-type or p-type dopant.

A base insulation layer 110 may be disposed on the substrate 101. The base insulation layer 110 may electrically insulate the first to third gate electrode structures 12, 14 and 16; the first to fourth gate dielectric layers 310, 320, 330 and 340; the first to fourth channel layers 410, 420, 430 and 440; the first and second resistance change structures 22 and 24; and the first to eighth bit line structures 32a, 32b, 32c, 32d, 34a, 34b, 34c and 34d from the substrate 101.

Although not illustrated in FIG. 1, at least one conductive layer and at least one insulation layer may be disposed between the substrate 101 and the base insulation layer 110. The conductive layer and the insulation layer may form various circuit patterns. That is, the conductive layer and the insulation layer may form a plurality of wirings, or may constitute passive elements such as a capacitor or a resistor, or active elements such as a diode or a transistor, by way of non-limiting examples.

Referring to FIG. 1 again, the first gate electrode structure 12 may be disposed on the base insulation layer 110. The first gate electrode structure 12 may include first to fourth gate electrode layer patterns 122a, 122b, 122c and 122d and first to fifth gate insulation layer patterns 132a, 132b, 132c, 132d and 132e, which are alternately stacked on the base insulation layer 110 in a first direction (i.e., the z-direction) perpendicular to the substrate 101. Here, the first gate electrode structure 12 may extend in a second direction (i.e., the y-direction) perpendicular to the first direction (i.e., the z-direction). The first to fourth gate electrode layer patterns 122a, 122b, 122c and 122d may be electrically insulated from each other by the first to fifth gate insulation layer patterns 132a, 132b, 132c, 132d and 132e with respect to the first direction (i.e., the z-direction). The first to fourth gate electrode layer patterns 122a, 122b, 122c and 122d may be conductive lines extending in the second direction (i.e., the y-direction). Each of the first to fourth gate electrode layer patterns 122a, 122b, 122c and 122d may be independently controlled to have a predetermined potential.

In an embodiment, the first to fourth gate electrode layer patterns 122a, 122b, 122c and 122d may each have a conductive material. The conductive material may include, for example, doped semiconductor, metal, conductive metal silicide, conductive metal nitride, conductive metal oxide, or the like. The first to fifth gate insulation layer patterns 132a, 132b, 132c, 132d and 132e may each include an insulative material. The insulative material may include, for example, oxide, nitride, oxynitride, or similar materials.

Referring to FIGS. 1 and 3, the first gate dielectric layer 310 covering a sidewall surface 12S of the first gate electrode structure 12 may be disposed on the base insulation layer 110. As illustrated, the one sidewall surface 12S of the first gate electrode structure 12 may be a plane formed by the first and second directions (i.e., the z-direction and y-direction). The first gate dielectric layer 310 may have a predetermined thickness in a third direction (i.e., the x-direction) perpendicular to the first and second directions. The first gate dielectric layer 310 may include, for example, silicon oxide, silicon nitride, silicon oxynitride, aluminum oxide, hafnium oxide, zirconium oxide, or the like.

The first channel layer 410 may be disposed on the first gate dielectric layer 310. For example, the first channel layer 410 may be disposed on a plane formed by the first and second directions (i.e., the z-direction and y-direction). In addition, the first channel layer 410 may have a predetermined thickness in the third direction, i.e., the x-direction.

When a predetermined gate voltage is applied to the first to fourth gate electrode layer patterns 122a, 122b, 122c and 122d, a charge density of a region of the first channel layer 410 corresponding respectively to the first to fourth gate electrode layer patterns 122a, 122b, 122c and 122d in the third direction (i.e., the x-direction) may be changed. In an embodiment, when a gate voltage greater than or equal to a predetermined threshold voltage is applied to the first to fourth gate electrode layer patterns 122a, 122b, 122c and 122d, the charge density in the corresponding region of the first channel layer 410 may become sufficiently large, and thus, a conductive channel may be formed in respective areas of the first channel layer 410. The conductive channel may have a predetermined width in the third direction (i.e., the x-direction) and may have a predetermined length in the second direction (i.e., the y-direction) The conductive channel may have a height in the first direction (i.e., the z-direction) that corresponds to a thickness of the first to fourth gate electrode layer pattern 122a, 122b, 122c and 122d. By forming a conductive channel, a region of the first channel layer 410 may be converted from a nonconductor to a conductor. The conductive channel may be formed to extend along the second direction (i.e., the y-direction).

Although not illustrated, a source line electrically connected to the first channel layer 410 may be disposed at an end of the first channel layer 410. The source line may provide a predetermined source voltage to the first channel layer 410. After the conductive channel is formed, the conductive channel may maintain a predetermined potential by the source voltage provided by the source line.

The first channel layer 410 may, for example, include doped semiconductor, metal oxide, or transition metal di-chalcogenide (TMDC). The semiconductor may include silicon (Si), germanium (Ge), or gallium arsenide (GaAs), for example. The metal oxide may include indium-gallium-zinc oxide, for example. In an embodiment, the first channel layer 410 may include silicon (Si) doped with an n-type dopant. Alternatively, the first channel layer 410 may include c-axis aligned indium-gallium-zinc oxide. The transition metal di-chalcogenide (TMDC) may include molybdenum disulfide (MoS2), molybdenum diselenide (MoSe2,) molybdenum telluride (MoTe2), tungsten disulfide (WS2), or tungsten diselenide (WSe2), for example.

Referring to FIGS. 1 to 3 again, the first resistance change structure 22 may be disposed on the base insulation layer 110 and contact the first channel layer 410. The first resistance change structure 22 may have a predetermined height in the first direction (i.e., the z-direction), have a predetermined length in the second direction (i.e., the y-direction), and have a predetermined width in the third direction (i.e., the x-direction). Viewed in the x-direction, the first resistance change structure 22 may extend in the second direction (i.e., the y-direction) to cover or be co-extensive with the first to fourth gate electrode layer patterns 122*a*, 122*b*, 122*c* and 122*d*. In an embodiment, the first resistance change structure 22 may have a first sidewall surface 22S1 in contact with one sidewall surface of the first channel layer 410. A second sidewall surface 22S2 of the first resistance change structure 22 may contact the second channel layer 420.

The first resistance change structure 22 may include an oxide material having oxygen vacancies. The oxide material may, for example, include silicon oxide, aluminum oxide, tantalum oxide, titanium oxide, hafnium oxide, or a combination of two or more thereof.

The first to fourth bit line structures 32*a*, 32*b*, 32*c* and 32*d* may be disposed within the first resistance change structure 22. That is, the first resistance change structure 22 may be disposed to surround or overlap the sidewalls of the first to fourth bit line structures 32*a*, 32*b*, 32*c* and 32*d*.

The first to fourth bit line structures 32*a*, 32*b*, 32*c* and 32*d* may extend or be spaced apart in the first direction (i.e., the z-direction) from the base insulation layer 110. The first to fourth bit line structures 32*a*, 32*b*, 32*c* and 32*d* may each have a pillar shape with an elliptical or rectangular cross-section. Referring to FIGS. 2 and 3, the first to fourth bit line structures 32*a*, 32*b*, 32*c* and 32*d* may be disposed to be spaced apart from the first sidewall surface 22S1 of the first resistance change structure 22 in the third direction (i.e., the x-direction) by a first distance dl, and may be disposed to be spaced apart from the second sidewall surface 22S2 of the first resistance change structure 22 in the third direction (i.e., the x-direction) by a second distance d2. In other words, the first to fourth bit line structures 32*a*, 32*b*, 32*c* and 32*d* may be disposed to be spaced apart from the first channel layer 410 in the third direction (i.e., the x-direction) by the first distance d1, and may be disposed to be spaced apart from the second channel layer 420 in the third direction (i.e., the x-direction) by the second distance d2. In an embodiment, the first distance dl and the second distance d2 may have the same or substantially the same magnitude.

The first to fourth bit line structures 32*a*, 32*b*, 32*c* and 32*d* may each include a conductive material. The conductive material may, for example, include doped semiconductor, metal, conductive metal nitride, conductive metal carbide, conductive metal silicide, or conductive metal oxide. The conductive material may, for example, include n-type or p-type doped silicon (Si), tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

A predetermined bit line voltage may be applied to the first to fourth bit line structures 32*a*, 32*b*, 32*c* and 32*d*. The bit line voltage may be independently controlled for each of the first to fourth bit line structures 32*a*, 32*b*, 32*c* and 32*d*. The first to fourth bit line structures 32*a*, 32*b*, 32*c* and 32*d*, to which a bit line voltage is applied, may maintain a predetermined bit potential.

Referring to FIGS. 1 to 3 again, a predetermined gate voltage may be applied to any one of the first to fourth gate electrode layer patterns 122*a*, 122*b*, 122*c* and 122*d*, so that a first conductive channel may be formed in a region of the first channel layer 410 corresponding to, in the x-direction, one of the gate electrode layer patterns. The first conductive channel may extend in the second direction (i.e., the y-direction). When the first conductive channel is formed, a source voltage may be applied to the first conductive channel from the source line that is electrically connected to the first channel layer 410, so that the first conductive channel may have a predetermined channel potential. When a bit line voltage is applied to any one of the first to fourth bit line structures 32*a*, 32*b*, 32*c* and 32*d*, the one bit line structure may maintain a bit potential.

A region of the first resistance change structure 22 where, when viewed in the x-direction, the first conductive channel and the one bit line structure overlap may function as a resistive memory cell of the nonvolatile memory device 1. In the resistive memory cell, when a voltage due to a difference between the channel potential and the bit potential is applied, a write operation or a read operation may be performed. Specifically, when the voltage is greater than a predetermined set voltage or reset voltage, a set operation or a reset operation of the resistive memory cell may be performed. The set operation may be an operation of converting an electrical resistance of the resistive memory cell from a relatively high resistance state into a relatively low resistance state. The converted resistance of the low resistance state may be stored in the resistive memory cell in a nonvolatile manner even after the set voltage is removed. The reset operation may be an operation of converting an electrical resistance of the resistive memory cell from a relatively low resistance state into a relatively high resistance state. The converted resistance of the high resistance state may be stored in the resistive memory cell in a nonvolatile manner even after the reset voltage is removed. When the voltage corresponds to a predetermined read voltage, a read operation on the resistive memory cell may be performed. The read operation may be an operation of reading a resistance stored in the resistive memory cell by measuring a current between the conductive channel and the one bit line structure.

Referring to FIGS. 1 to 3, the second channel layer 420 may be disposed on a second sidewall surface 22S2 of the first resistance change structure 22. As illustrated in FIGS. 2 and 3, the second channel layer 420 may be disposed to be spaced apart from the first to fourth bit line structures 32*a*, 32*b*, 32*c* and 32*d* in the third direction (i.e., the x-direction) by the second distance d2. A configuration of the second channel layer 420 may be substantially the same as a configuration of the first channel layer 410.

A second gate dielectric layer 320 may be disposed on the second channel layer 420. The second gate dielectric layer 320 may be disposed on a plane formed in the first and second directions (i.e., a z-direction and a y-direction). In addition, the second gate dielectric layer 320 may have a predetermined thickness in a third direction (i.e., the x-direction). A configuration of the second gate dielectric layer 320 may be substantially the same as the configuration of the first gate dielectric layer 310.

A second gate electrode structure 14 may be disposed on the base insulation layer 110 and contact the second gate dielectric layer 320. The second gate electrode structure 14 may include first to fourth gate electrode layer patterns 124a, 124b, 124c and 124d and first to fifth gate insulation layer patterns 134a, 134b, 134c, 134d and 134e, which are alternately stacked in the first direction (i.e., the z-direction). The second gate electrode structure 14 may extend in the second direction (i.e., the y-direction). The configurations of the first to fourth gate electrode layer patterns 124a, 124b, 124c and 124d and the first to fifth gate insulation layer patterns 134a, 134b, 134c, 134d and 134e of the second gate electrode structure 14 may be substantially the same as the configurations of the first to fourth gate electrode layer patterns 122a, 122b, 122c and 122d and the first to fifth gate insulation layer patterns 132a, 132b, 132c, 132d and 132e of the first gate electrode structure 12, respectively.

Referring to FIGS. 1 to 3 again, a third gate dielectric layer 330 may be disposed on a sidewall surface of the second gate electrode structure 14 opposite to that on which the second gate dielectric layer 320 is formed. In an embodiment, the third gate dielectric layer 330 may be disposed on a plane formed in the first and second directions (i.e., a z-direction and a y-direction), and have a predetermined thickness in the third direction (i.e., the x-direction). The third gate dielectric layer 330, when viewed in the x-direction, may be disposed to cover or to be co-extensive with the first to fourth gate electrode layer patterns 124a, 124b, 124c and 124d and the first to fifth gate insulation layer patterns 134a, 134b, 134c, 134d and 134e. A configuration of the third gate dielectric layer 330 may be substantially the same as a configuration of the second gate dielectric layer 320.

A third channel layer 430 may be disposed on the third gate dielectric layer 330. In an embodiment, the third channel layer 430 may be disposed on a plane formed in the first and second directions (i.e., a z-direction and a y-direction), and may have a predetermined thickness in a third direction (i.e., the x-direction). A configuration of the third channel layer 430 may be substantially the same as a configuration of the second channel layer 420.

Referring to FIGS. 1 to 3 again, a second resistance change structure 24 may be disposed on the base insulation layer 110 and contact the third channel layer 430. The second resistance change structure 24 may have a predetermined height in the first direction (i.e., the z-direction), have a predetermined length in the second direction (i.e., the y-direction), and have a predetermined width in the third direction (i.e., the x-direction). In an embodiment, the second resistance change structure 24 may have a first sidewall surface 24S1 in contact with a sidewall surface of the third channel layer 430. A second sidewall surface 24S2 of the second resistance change structure 24 may contact a fourth channel layer 440. A configuration of the second resistance change structure 24 may be substantially the same as a configuration of the first resistance change structure 22.

Fifth to eighth bit line structures 34a, 34b, 34c and 34d may be disposed within the second resistance change structure 24. That is, the second resistance change structure 24 may be disposed to surround or envelop sidewalls of the fifth to eighth bit line structures 34a, 34b, 34c and 34d.

The fifth to eighth bit line structures 34a, 34b, 34c and 34d may be disposed, in the third direction (i.e., the x-direction), to be spaced apart from the third channel layer 430 by a third distance d3 and spaced apart from a fourth channel layer 440 by a fourth distance d4. In an embodiment, the third distance d3 and the fourth distance d4 may have the same or substantially the same magnitude. The configurations of the fifth to eighth bit line structures 34a, 34b, 34c and 34d in the second resistance change structure 24 may be substantially the same as the configurations of the first to fourth bit line structures 32a, 32b, 32c and 32d in the first resistance change structure 22.

Referring to FIGS. 1 to 3 again, in connection with operations of a resistive memory cell, a predetermined gate voltage may be applied to any one of the first to fourth gate electrode layer patterns 124a, 124b, 124c and 124d of the second gate electrode structure 14. At this time, a second and a third conductive channel may be formed in regions of the second and third channel layers 420 and 430, respectively, which are covered by or overlap with gate electrode layer patterns in the third direction (i.e., the x-direction). The second and third conductive channels may extend in the second direction (i.e., the y-direction). When the second and third conductive channels are formed, a predetermined source voltage may be applied to the second and third conductive channels from the source lines electrically connected to the second and third channel layers 420 and 430, so that the second and third conductive channels may each have a predetermined channel potential. When a bit line voltage is applied to at least one of the first to eighth bit line structures 32a, 32b, 32c, 32d, 34a, 34b, 34c and 34d, a write operation or a read operation as described above may occur in a resistive memory cell region between the at least one bit line structure and the second and third conductive channels. Resistive memory cell regions may be regions of the first resistance change structure 22, in which the first to fourth bit line structures 32a, 32b, 32c and 32d and the second conductive channel overlap in the third direction (i.e., the x-direction). In addition, resistive memory cell regions may be regions of the second resistance change structure 24, in which the fifth to eighth bit line structures 34a, 34b, 34c and 34d and the third conductive channel overlap in the third direction (i.e., the x-direction).

Referring to FIGS. 1 to 3 again, a fourth gate dielectric layer 340 may be disposed on the fourth channel layer 440. The fourth gate dielectric layer 340 may be disposed on a plane formed in the first and second directions (i.e., a z-direction and a y-direction), and have a predetermined thickness in the third direction (i.e., the x-direction). A configuration of the fourth gate dielectric layer 340 may be substantially the same as a configuration of the third gate dielectric layer 330.

A third gate electrode structure 16 may be disposed on the base insulation layer 110 and contact the fourth gate dielectric layer 340. The third gate electrode structure 16 may include first to fourth gate electrode layer patterns 126a, 126b, 126c and 126d and first to fifth gate insulation layer patterns 136a, 136b, 136c, 136d and 136e, which are alternately stacked in the first direction (i.e., the z-direction). The third gate electrode structure 16 may extend in the second direction (i.e., the y-direction). Configurations of the first to fourth gate electrode layer patterns 126a, 126b, 126c and 126d and the first to fifth gate insulation layer patterns 136a, 136b, 136c, 136d and 136e of the third gate electrode structure 16 may be substantially the same as the configurations of the first to fourth gate electrode layer patterns 122a, 122b, 122c and 122d and the first to fifth gate insulation layer patterns 132a, 132b, 132c, 132d and 132e of the first gate electrode structure 12.

Referring to FIGS. 1 to 3 again, in connection with operations of the resistive memory cell, a predetermined gate voltage may be applied to any one of the first to fourth gate electrode layer patterns 126a, 126b, 126c and 126d of the third gate electrode structure 16. At this time, a fourth conductive channel may be formed in a region of the fourth channel layer 440 covered by a gate electrode layer pattern in the third direction (i.e., the x-direction). The fourth conductive channel may extend along the second direction (i.e., the y-direction). When the fourth conductive channel is formed, a predetermined source voltage is applied to the fourth conductive channel from the source line electrically connected to the channel layer 440 so that the fourth conductive channel may have a predetermined channel potential. At this time, when a bit line voltage is applied to at least one of the fifth to eighth bit line structures 34a, 34b, 34c and 34d, a write operation or a read operation as described above may occur in the resistive memory cell region between the at least one bit line structure and the fourth conductive channel. Resistive memory cell regions may be regions of the second resistance change structure 24 positioned at regions where the fifth to eighth bit line structures 34a, 34b, 34c and 34d and the fourth conductive channel overlap in the third direction (i.e., the x-direction).

In some other embodiments, the number of the gate electrode layer patterns of the first to third gate electrode structures 12, 14 and 16 is not necessarily limited to four, and various other numbers are possible. In addition, the number of the gate insulation layer patterns is not necessarily limited to five, and various other numbers are possible. Similarly, the number of the bit line structures inside the first and second resistance change structures 22 and 24 is not necessarily limited to four, but various other numbers are possible.

In some other embodiments, disposed on the base insulation layer 110, a pair of the gate electrode structures 12 and 14, a structure there between including the resistance change structure 22; a pair of gate dielectric layers 310 and 320; and a pair of channel layers 410 and 420 may be designated as a unit of a nonvolatile memory device.

Referring to FIGS. 1 to 3 again, in a unit of a nonvolatile memory device, each of the pair of the gate electrode structures 12 and 14 may be disposed on the base insulation layer 110 to be spaced apart from each other in the x-direction. The first gate insulation layer 310 and first channel layer 410 may be sequentially disposed, in the x-direction, on a sidewall of gate electrode structure 12, and the second channel layer 420 and second gate insulation layer 320 may be sequentially disposed on a sidewall surface of the gate electrode structure 14. The resistance change structure 22 may be disposed on the base insulation layer 110 and fill an area between the pair of the gate electrode structures 12 and 14. The resistance change structure 22 may be disposed to contact the first and second channel layers 410 and 420. The first to fourth bit line structures 32a and 32b, 32c, and 32d may be arranged in the resistance change structure 22 to extend in the first direction (i.e., the z-direction) from the base insulation layer 110, and to be spaced apart from each other along the second direction (i.e., the y-direction). The unit of the nonvolatile memory device may be repeatedly arranged along the third direction (i.e., the x-direction). As a result, a nonvolatile memory device 1 may be configured with a plurality of units of a nonvolatile memory device.

Figure 4:
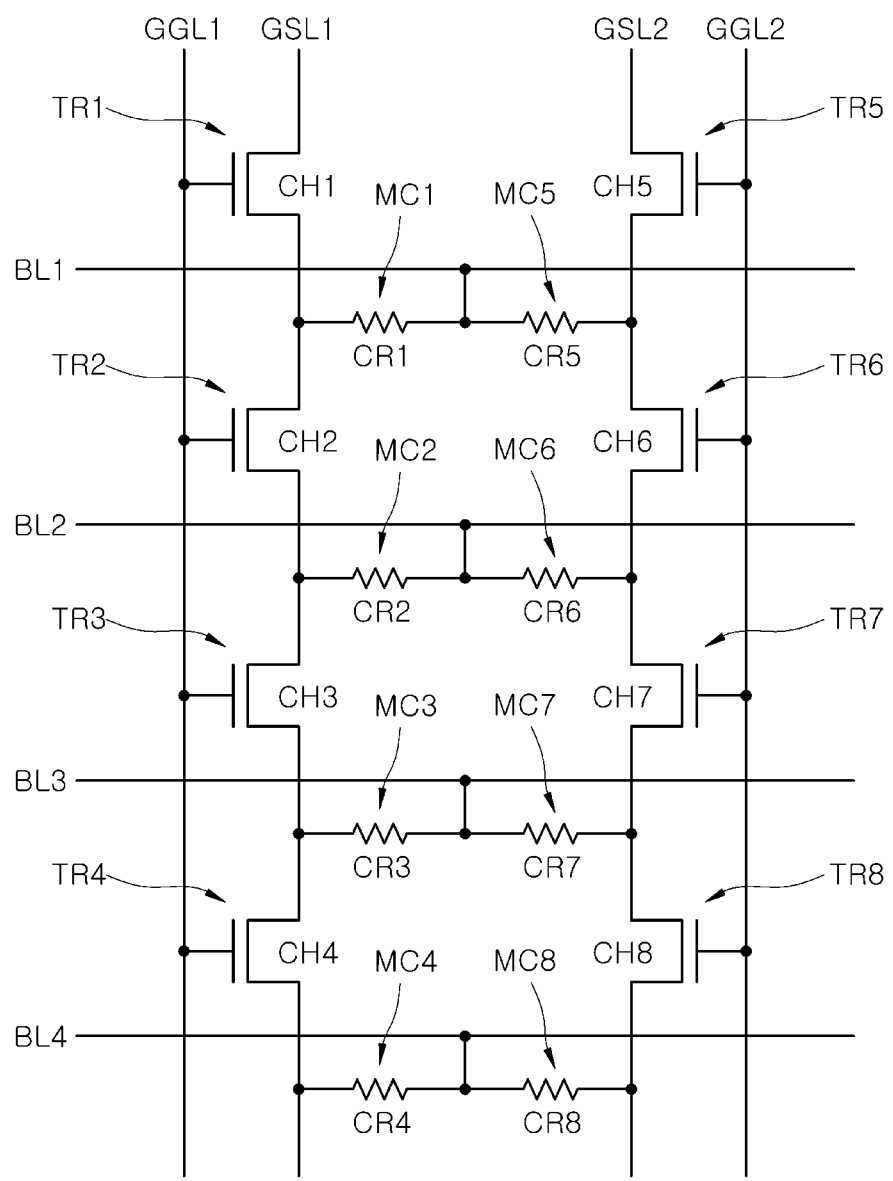
FIG. 4 is a schematic circuit diagram of a nonvolatile memory device according to an embodiment of the present disclosure.

FIG. 4 is a schematic circuit diagram of a nonvolatile memory device according to an embodiment of the present disclosure. The circuit diagram 2 of FIG. 4 may correspond to a part of the nonvolatile memory device 1 described above with reference to FIGS. 1 to 3.

Referring to FIG. 4, there are disclosed first to eighth resistive memory cells MC1, MC2, MC3, MC4, MC5, MC6, MC7 and MC8. The first to eighth resistive memory cells MC1, MC2, MC3, MC4, MC5, MC6, MC7 and MC8 may include corresponding first to eighth selection transistors TR1, TR2, TR3, TR4, TR5, TR6, TR7 and TR8 and first to eighth resistive memory layers CR1, CR2, CR3, CR4, CR5, CR6, CR7 and CR8. The first to eighth resistive memory layers CR1, CR2, CR3, CR4, CR5, CR6, CR7 and CR8 may be connected to corresponding drain terminals of the first to eighth selection transistors TR1, TR2, TR3, TR4, TR5, TR6, TR7 and TR8.

In an embodiment, the first to fourth selection transistors TR1, TR2, TR3 and TR4 may be connected in series to each other to form a string. As illustrated in FIG. 4, a source terminal of the first selection transistor TR1 may be electrically connected to a first global source line GSL1. Gates of the first to fourth selection transistors TR1, TR2, TR3 and TR4 may be commonly connected to a first global gate line GGL1. That is, when a gate voltage of a predetermined threshold voltage or higher is applied to the first global gate line GGL1, the first to fourth selection transistors TR1, TR2, TR3 and TR4 may be simultaneously turned on to form conductive channels CH1, CH2, CH3 and CH4, respectively. The conductive channels CH1, CH2, CH3 and CH4 may each maintain a predetermined channel potential based on a voltage provided from the first global source line GSL1.

One end of each of the first to fourth resistive memory layers CR1, CR2, CR3 and CR4 of the first to fourth resistive memory cells MC1, MC2, MC3 and MC4 may be connected to a corresponding drain terminal of the first to fourth selection transistors TR1, TR2, TR3 and TR4, respectively. The other end of each of the first to fourth resistive memory layers CR1, CR2, CR3 and CR4 may be connected to a corresponding first to fourth bit lines BL1, BL2, BL3 and BL4, respectively. Here, when any one of the first to fourth bit lines BL1, BL2, BL3 and BL4 is selected, a bit line voltage may be applied to the selected bit line. Accordingly, the selected bit line may maintain a predetermined bit potential.

In an embodiment, when the first to fourth selection transistors TR1, TR2, TR3 and TR4 are simultaneously turned on by the gate voltage, and the bit line voltage is applied to the first bit line BL1, an operation voltage that is the difference of the channel potential and the bit potential may be applied to both ends of the first resistive memory layer CR1 of the first resistive memory cell MC1. The operation voltage may be a write voltage for performing a write operation or a read voltage for performing a read operation for the first resistive memory layer CR1. Similarly, when the first to fourth selection transistors TR1, TR2, TR3 and TR4 are simultaneously turned on by the gate voltage, and the bit line voltage is applied to any one of the second to fourth bit lines BL2, BL3 and BL4, a write operation or a read operation may be performed on any one of the corresponding second to fourth resistive memory cells MC2, MC3 and MC4, respectively.

In an embodiment, the fifth to eighth selection transistors TR5, TR6, TR7 and TR8 may be connected in series to each other to form a string. As illustrated in FIG. 4, a source terminal of the fifth selection transistor TR5 may be electrically connected to a second global source line GSL2. Gates of the fifth to eighth selection transistors TR5, TR6, TR7 and TR8 may be commonly connected to a second global gate line GGL2. That is, when a gate voltage of a predetermined threshold voltage or higher is applied to the second global gate line GGL2, the fifth to eighth selection transistors TR5, TR6, TR7 and TR8 may be simultaneously turned on to form conductive channels CH5, CH6, CH7 and CH8, respectively. The conductive channels CH5, CH6, CH7 and CH8 may each maintain a predetermined channel potential based on a voltage provided from the second global gate line GGL2.

One end of each of the fifth to eighth resistive memory layers CR5, CR6, CR7 and CR8 of the fifth to eighth resistive memory cells MC5, MC6, MC7 and MC8 may be connected to a corresponding drain terminal of the fifth to eighth selection transistors TR5, TR6, TR7 and TR8, respectively. The other end of each of the fifth to eighth resistive memory layers CR5, CR6, CR7 and CR8 may be connected to a corresponding first to fourth bit lines BL1, BL2, BL3 and BL4, respectively. At this time, when any one of the first to fourth bit lines BL1, BL2, BL3 and BL4 is selected, a bit line voltage may be applied to the selected bit line. The selected bit line may maintain a predetermined bit potential.

In an embodiment, when the fifth to eighth selection transistors TR5, TR6, TR7 and TR8 are simultaneously turned on by the gate voltage, and the bit line voltage is applied to the first bit line BL1, an operation voltage that is the difference of the channel potential and the bit potential may be applied to both ends of the fifth resistive memory layer CR5 of the fifth resistive memory cell MC5. The operation voltage may be a write voltage for performing a write operation or a read voltage for performing a read operation for the fifth resistive memory layer CR5. Similarly, when the fifth to eighth selection transistors TR5, TR6, TR7 and TR8 are simultaneously turned on by the gate voltage, and the bit line voltage is applied to any one of the second to fourth bit lines BL2, BL3 and BL4, a write operation or a read operation may be performed on any one of the corresponding sixth to eighth resistive memory cells MC6, MC7 and MC8, respectively.

Referring to FIG. 4 again, the first and fifth resistive memory layers CR1 and CR5 may share the first bit line BL1. Similarly, the second and sixth resistive memory layers CR2 and CR6, the third and seventh memory layers CR3 and CR7, and the fourth and eighth memory layers CR4 and CR8 may share the second bit line BL2, the third bit line BL3, and the fourth bit line BL4, respectively.

By selecting one of the first and second global gate lines GGL1 and GGL2, and by selecting one of the first to fourth bit lines BL1, BL2, BL3 and BL4, one of the first to eighth resistive memory cells MC1, MC2, MC3, MC4, MC5, MC6, MC7 and MC8 may be determined to be the resistive memory cell to which a write operation or a read operation is performed. That is, the nonvolatile memory device 2 may perform a write operation or a read operation with random access.

Figure 5:
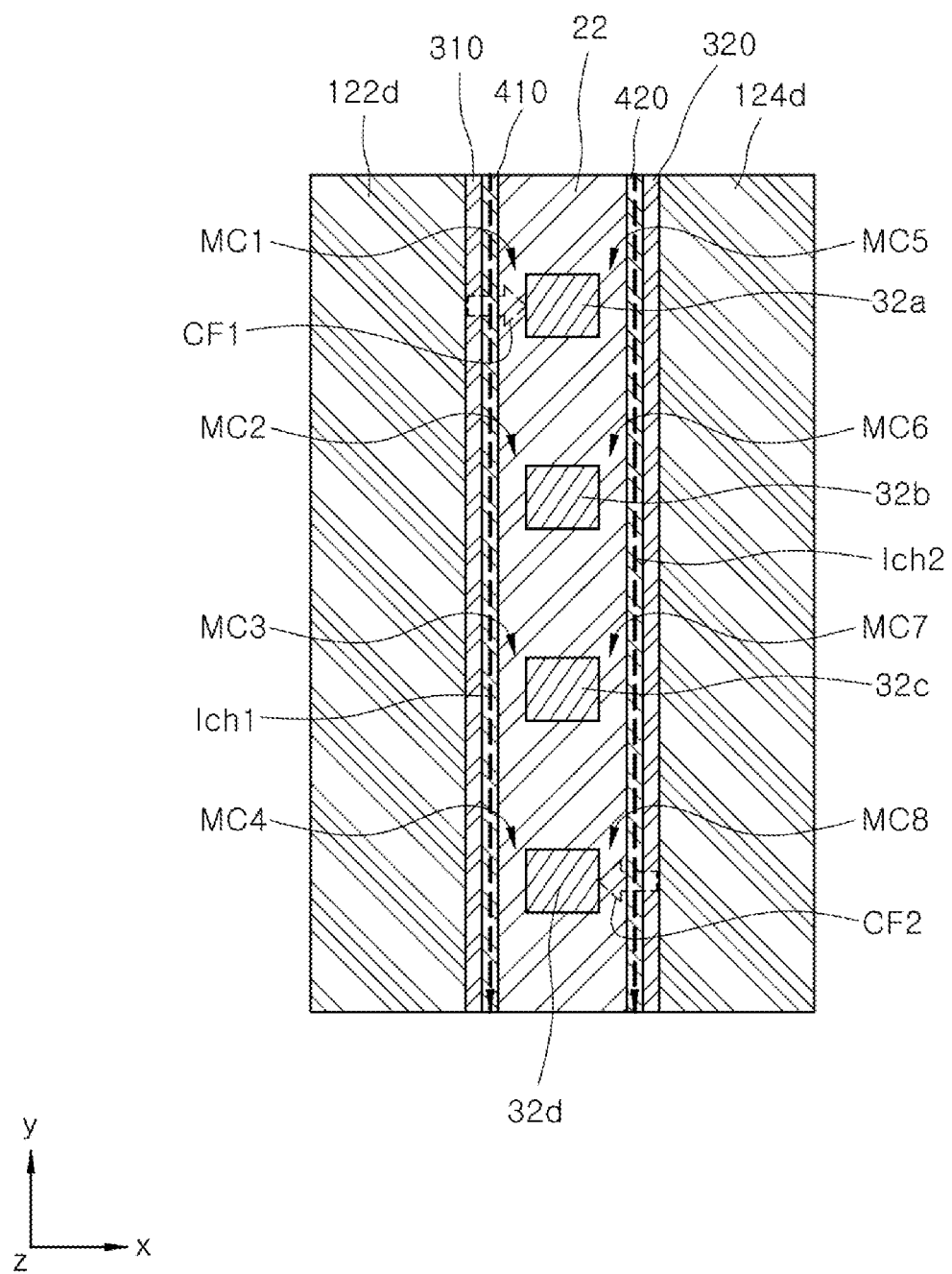
FIG. 5 is a view schematically illustrating a method of driving a nonvolatile memory device according to an embodiment of the present disclosure.

FIG. 5 is a view schematically illustrating a method of driving a nonvolatile memory device according to an embodiment of the present disclosure. FIG. 5 illustrates a portion of the circuit diagram of FIG. 4 of the nonvolatile memory device 1 described above with reference to FIGS. 1 to 3. FIG. 5 is a section of the nonvolatile memory device 1 in a plane perpendicular to the z-direction.

As a configuration for implementing the first to eighth resistive memory cells MC1, MC2, MC3, MC4, MC5, MC6, MC7 and MC8 of FIG. 4, FIG. 5 illustrates the fourth gate electrode layer pattern 122d of the first gate electrode structure 12, the first gate dielectric layer 310, the first channel layer 410, the first resistance change structure 22, the first to fourth bit line structures 32a, 32b, 32c and 32d, the second channel layer 420, the second gate dielectric layer 320 and the fourth gate electrode layer pattern 124d of the second gate electrode structure. Although omitted for convenience of description, in connection with the operation of other resistive memory cells, configurations and functions of the fourth gate electrode layer pattern 122d of the second gate electrode structure 14, the third gate dielectric layer 330, the third channel layer 430, the second resistance change structure 24, the fifth to eighth bit line structures 34a, 34b, 34c and 34d, the fourth channel layer 440, the fourth gate dielectric layer 340, and the fourth gate electrode layer pattern 126d of the third gate electrode structure 16 may be explained or described in substantially the same manner as the description below.

Hereinafter, as an example, a driving method of the first memory cell MC1 and the eighth memory cell MC8 of FIG. 4 will be specifically described.

In an embodiment, the first memory cell MC1 may be composed of, in a substantially horizontal plane as illustrated in FIG. 5, the fourth gate electrode layer pattern 122d of the first gate electrode structure 12, the first gate dielectric layer 310, the first channel layer 410, the first resistance change structure 22, and the first bit line structure 32a.

In driving the first memory cell MC1, the fourth gate layer pattern 122d may be selected among the first to fourth gate electrode layer patterns 122a, 122b, 122c and 122d of the first gate electrode structure 12. The fourth gate electrode layer pattern 122d may correspond to the first global gate electrode line GGL1 of FIG. 4. When a gate voltage of a predetermined threshold voltage or higher is applied to the fourth gate electrode layer pattern 122d, a conductive channel may be formed in the first channel layer 410 covered by or corresponding to the fourth gate electrode layer pattern 122d in a third direction (i.e., the x-direction). The conductive channel may extend in a second direction (i.e., the y-direction).

When the conductive channel is formed, a source voltage may be applied to the conductive channel from a first global source line (not illustrated) disposed at an end of the first channel layer 410. Accordingly, a predetermined channel current Ich1 may flow through the conductive channel in the second direction (i.e., the y-direction), and the conductive channel may maintain a predetermined channel potential.

The first bit line structure 32a may be selected from among the first to fourth bit line structures 32a, 32b, 32c and 32d. When a bit line voltage is applied to the selected first bit line structure 32a, the first bit line structure 32a may maintain a predetermined bit potential.

As described above, when the conductive channel in the first channel layer 410 maintains the channel potential and the first bit line structure 32a maintains the bit potential, an operation voltage corresponding to a difference between the channel potential and the bit potential may be applied to a region of the first resistance change structure 22 positioned where the first channel layer 410 and the first bit line structure 32a overlap. When the operation voltage is applied, a charge flow CF1 may occur between the conductive channel and the first bit line structure 32a.

The operation voltage may result in a write operation or a read operation in a region of the first resistance change structure 22, which corresponds to the first resistive memory cell MC1. The write operation may be an operation of variably changing an electrical resistance of a region of the first resistance change structure 22, in which the first channel layer 410 and the first bit line structure 32a overlap in the third direction, using a predetermined write operation voltage. After the write operation voltage is removed from the first resistance change structure 22, the changed resistance may be stored in the region of the first resistance change structure 22 in a nonvolatile manner. The read operation may be an operation of reading a resistance resulting from a predetermined read operation voltage in the third direction (i.e., the x-direction) of the overlapping region of the first resistance change structure 22.

In an embodiment, the resistance change may occur by operations in which conductive filaments are generated in the third direction in the overlapping region of the first resistance change structure 22, or in which the generated conductive filaments are partially disconnected with respect to the third direction, when different write voltages are applied to the first resistance change structure 22. In another embodiment, the resistance change may occur by an operation of generating an insulative thin film in the overlapping region of the first resistance change structure 22, or by removing the generated insulative thin film, according to different write voltages.

In another embodiment, the eighth resistive memory cell MC8 may be composed of the fourth gate electrode layer pattern 124d of the second electrode structure 14, the second gate dielectric layer 320, the second channel layer 420, the first resistance change structure 22, and the fourth bit line structure 32d.

In driving the eighth memory cell MC8, the fourth gate electrode layer pattern 124d may be selected among the first to fourth gate electrode layer patterns 124a, 124b, 124c and 124d of the second gate electrode structure 14. The fourth gate electrode layer pattern 124d may correspond to the second global gate electrode line GGL2 of FIG. 4. When a gate voltage of a predetermined threshold voltage or higher is applied to the fourth gate electrode layer pattern 124d, a conductive channel may be formed in the second channel layer 420 covered by or corresponding to the fourth gate electrode layer pattern 124d. The conductive channel may extend along the second direction (i.e., the y-direction).

When the conductive channel is formed, a source voltage may be applied from a second global source line (not shown) disposed at an end of the second channel 420. Accordingly, a predetermined channel current Ich2 may flow through the conductive channel in a direction parallel to the second direction (i.e., y-direction), and the conductive channel may maintain a predetermined channel potential.

Consequently, the fourth bit line structure 32d may be selected from among the first to fourth bit line structures 32a, 32b, 32c and 32d. When a bit line voltage is applied to the selected fourth bit line structure 32d, the fourth bit line structure 32d may maintain a predetermined bit potential.

As described above, when the conductive channel in the second channel layer 420 maintains the channel potential and the fourth bit line structure 32d maintains the bit potential, an operation voltage corresponding to a difference between the channel potential and the bit potential may be applied to a region of the first resistance change structure 22, positioned where the second channel layer 420 and the fourth bit line structure 32d overlap. When the operation voltage is applied, a charge flow CF2 may occur between the conductive channel and the first bit line structure 32d.

The operation voltage may result in a write operation or a read operation for a region of the first resistance change structure 22, which corresponds to the eighth resistive memory cell MC8. The write operation may be an operation of variably changing an electrical resistance of a region of the first resistance change structure 22, in which the second channel layer 420 and the fourth bit line structure 32d overlap in the third direction (i.e., the x-direction), using a predetermined write operation voltage. After the write operation voltage is removed from the first resistance change structure 22, the changed resistance may be stored in the region of the first resistance change structure 22 in a nonvolatile manner. The read operation may be an operation of reading a resistance of the region of the first resistance change structure 22 in contact with the second channel layer 420 along the third direction (i.e., the x-direction), using a predetermined read operation voltage.

In an embodiment, the resistance change may occur by operations in which conductive filaments are generated in the third direction (i.e., the x-direction) in the overlapping region of the first resistance change structure 22, or in which the generated conductive filaments are partially disconnected with respect to the third direction (i.e., the x-direction), when different write voltages are applied to the first resistance change structure 22. In another embodiment, the resistance change may occur by an operation of generating an insulative thin film in a region of the first resistance change structure 22, or by removing the generated insulative thin film.

Figure 6:
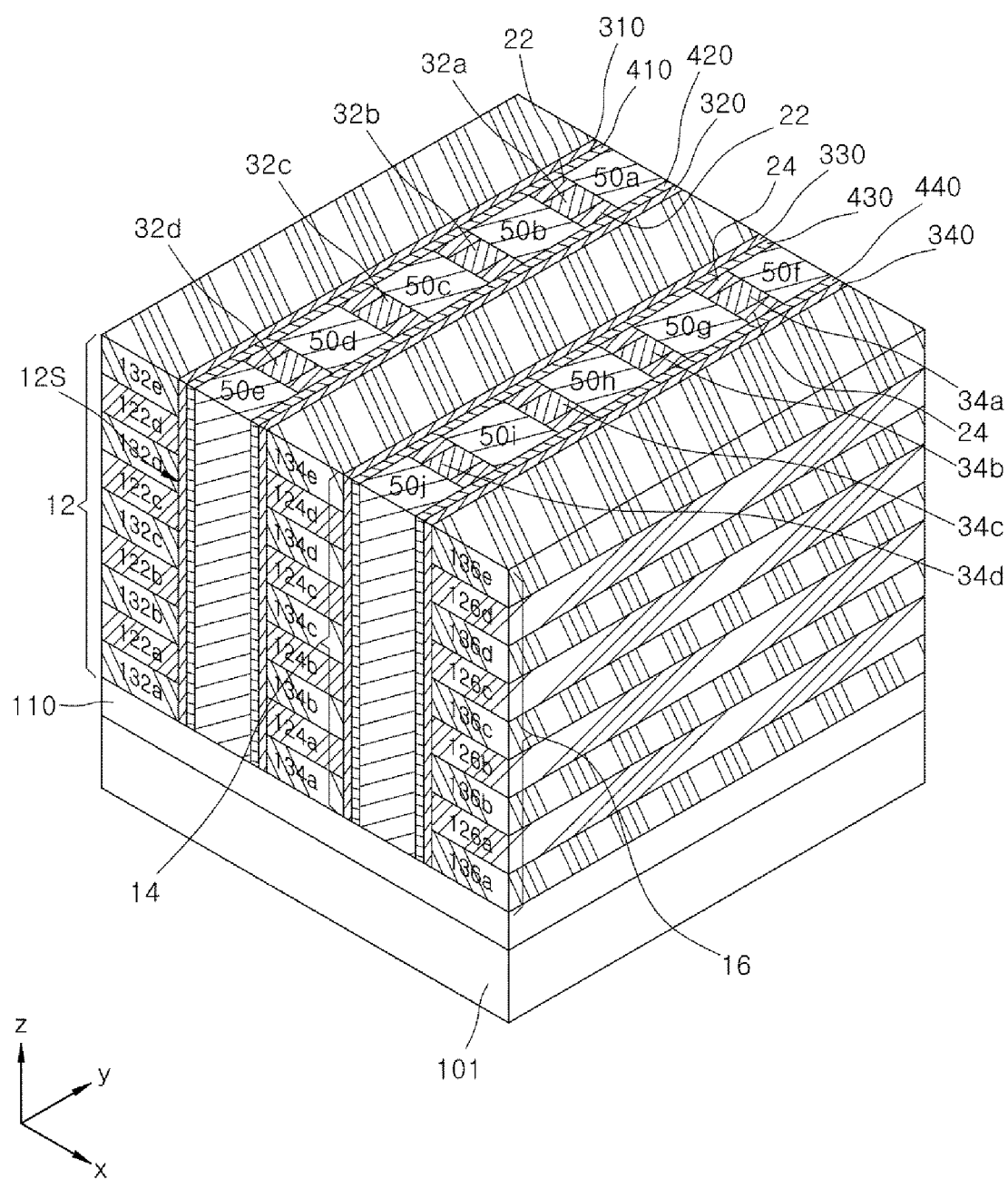
FIG. 6 is a perspective view schematically illustrating a nonvolatile memory device according to another embodiment of the present disclosure.
Figure 7:
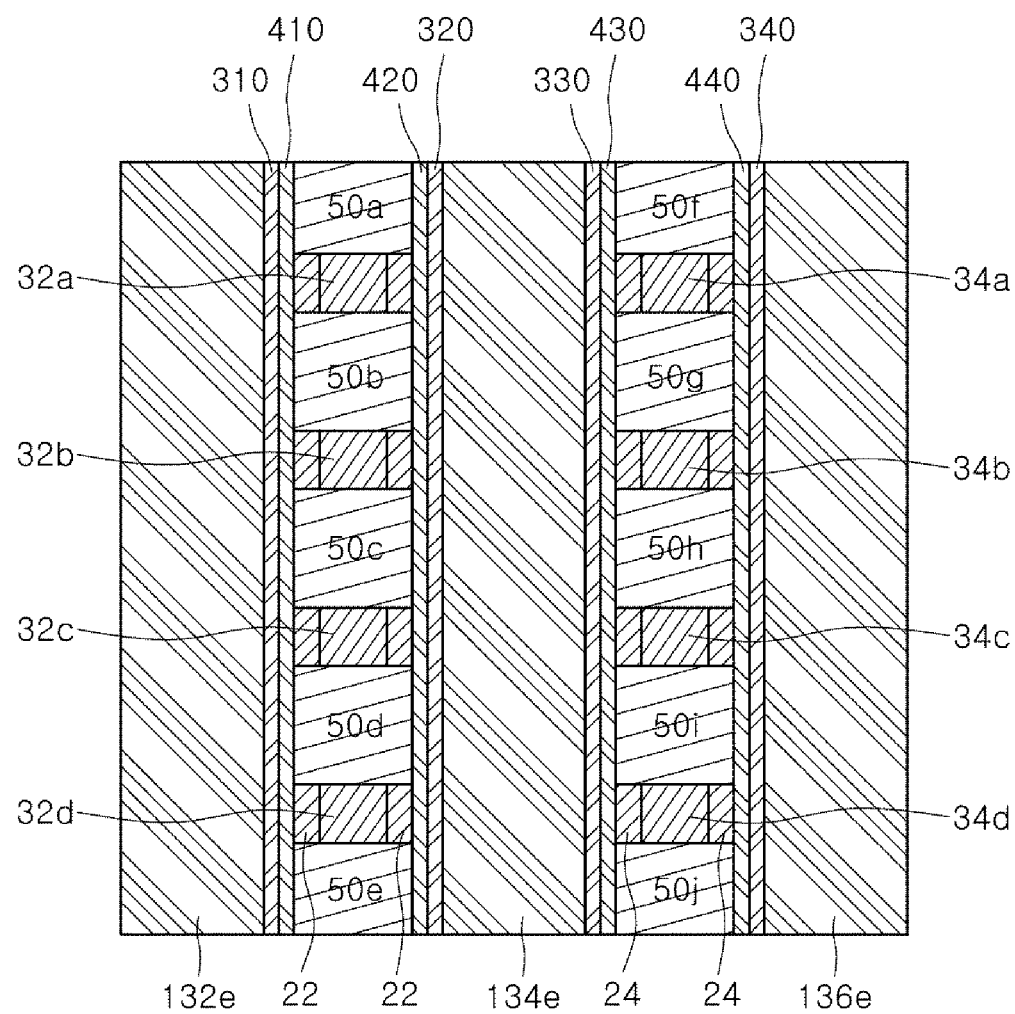
FIG. 7 is a plan view of the nonvolatile memory device of FIG. 6.

FIG. 6 is a perspective view illustrating a nonvolatile memory device according to another embodiment of the present disclosure. FIG. 7 is a plan view of the nonvolatile memory device of FIG. 6.

Referring to FIGS. 6 and 7, in comparison with the nonvolatile memory device 1 of FIGS. 1 to 3, the nonvolatile memory device 3 further includes first to tenth cell insulation structures 50a, 50b, 50c, 50d, 50e, 50f, 50g, 50h, 50i and 50j.

The first to tenth cell insulation structures 50a, 50b, 50c, 50d, 50e, 50f, 50g, 50h, 50i and 50j may be disposed on a base insulation layer 110 to extend in a first direction (i.e., the z-direction). The first to tenth cell insulation structures 50a, 50b, 50c, 50d, 50e, 50f, 50g, 50h, 50i and 50j may be disposed to be spaced apart from each other inside first and second resistance change structures 22 and 24. The first to tenth cell insulation structures 50a, 50b, 50c, 50d, 50e, 50f, 50g, 50h, 50i and 50j may be disposed between neighboring first to eighth bit line structures 32a, 32b, 32c, 32d, 34a, 34b, 34c and 34d along a second direction (i.e., the y-direction). The first to tenth cell insulation structures 50a, 50b, 50c, 50d, 50e, 50f, 50g, 50h, 50i and 50j may electrically separate regions of the first and second resistance change structures 22 and 24, that is, between neighboring resistive memory layers along the second direction (i.e., the y-direction). Accordingly, it is possible to prevent electrical signals from interfering with each other between the neighboring resistive memory layers.

In an embodiment, the first to fifth cell insulation structures 50a, 50b, 50c, 50d, and 50e may be disposed to contact first and second channel layers 410 and 420 in a third direction (i.e., the x-direction). The sixth to tenth cell insulation structures 50f, 50g, 50h, 50i and 50j may be disposed to contact third and fourth channel layers 430 and 440 in the third direction (i.e., the x-direction).

Figure 8:
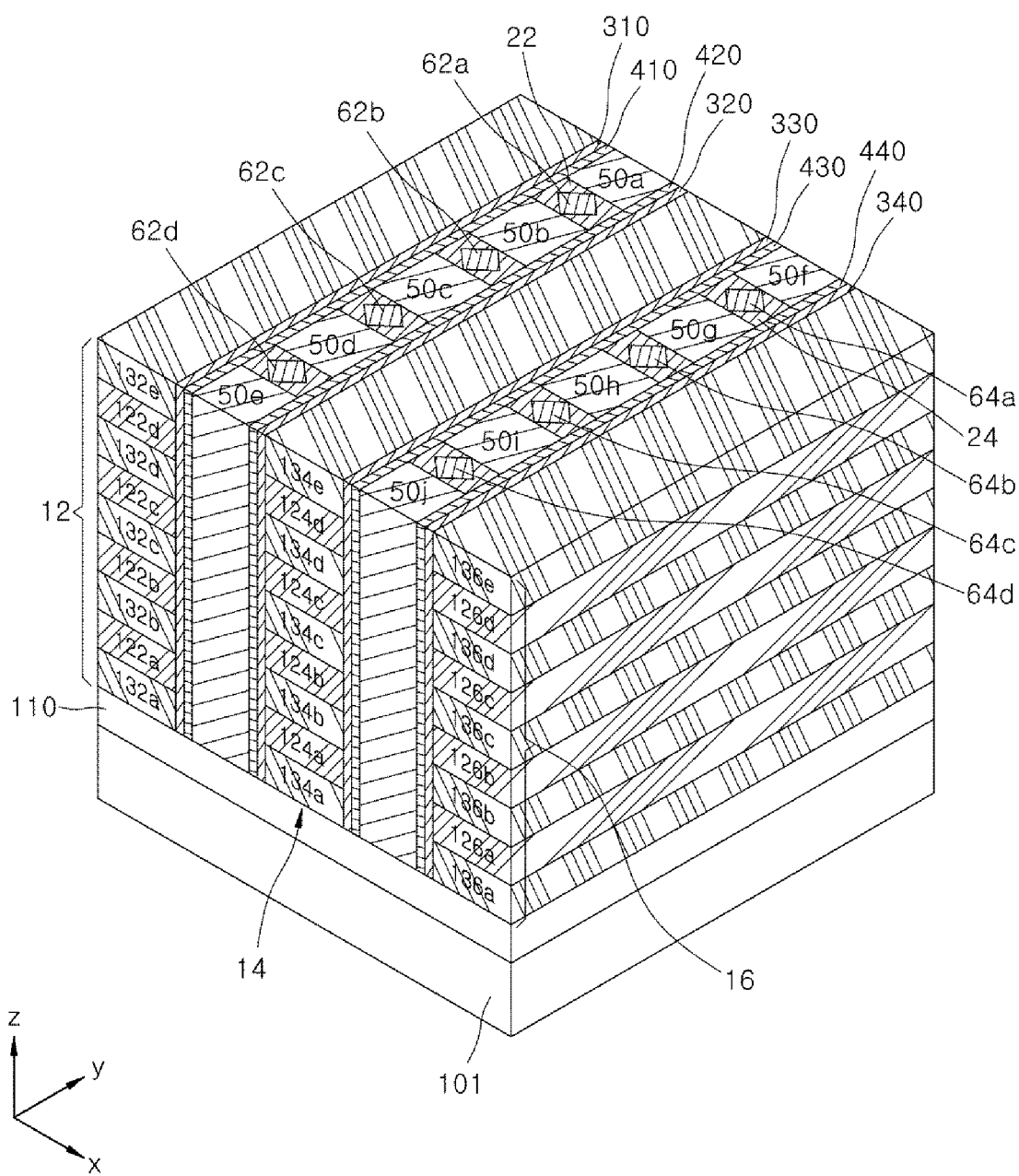
FIG. 8 is a perspective view schematically illustrating a nonvolatile memory device according to yet another embodiment of the present disclosure.
Figure 9:
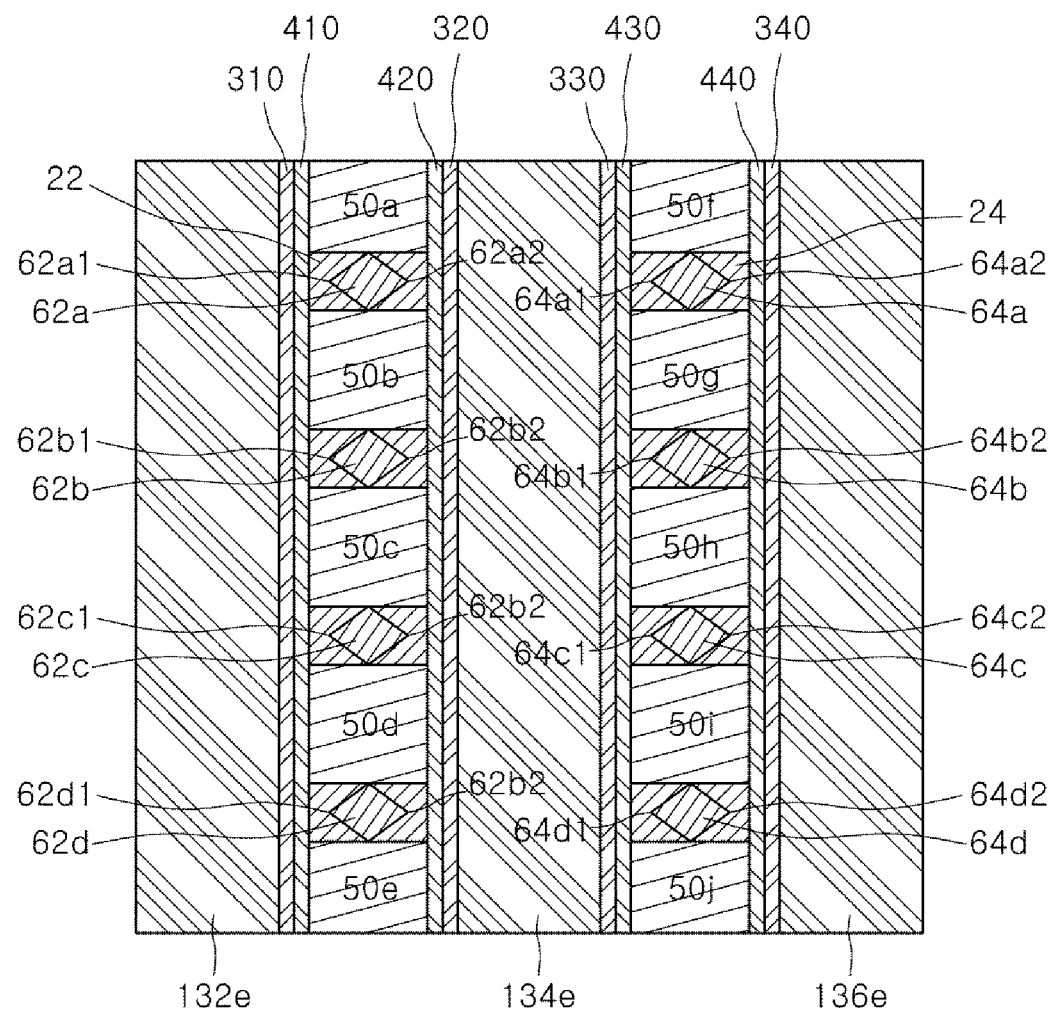
FIG. 9 is a plan view of the nonvolatile memory device of FIG. 8.

FIG. 8 is a perspective view schematically illustrating a nonvolatile memory device according to yet another embodiment of the present disclosure. FIG. 9 is a plan view of the nonvolatile memory device of FIG. 8.

Referring to FIGS. 8 and 9, in comparison with the nonvolatile memory device 3 of FIGS. 6 and 7, the nonvolatile memory device 4 may include first to eight bit line structures 62a, 62b, 62c, 62d, 64a, 64b, 64c and 64d having tip portions 62a1, 62a2, 62b1, 62b2, 62c1, 62c2, 62d1, 62d2, 64a1, 64a2, 64b1, 64b2, 64c1, 64c2, 64d1 and 64d2 protruding toward the first to fourth channel layers 410, 420, 430 and 440 in the x-direction.

Referring to FIGS. 8 and 9, each of the first to eighth bit line structures 62a, 62b, 62c, 62d, 64a, 64b, 64c and 64d may have a rhombus shape with four vertices on a plane perpendicular to a first direction (i.e., the z-direction). Two of the vertices may be disposed in a direction of the first to fourth channel layers 410, 420, 430 and 440. That is, the first to fourth bit line structures 62a, 62b, 62c and 62d may have tip portions 62a1, 62a2, 62b1, 62b2, 62c1, 62c2, 62d1 and 62d2 protruding toward the first and second channel layers 410 and 420. In addition, the fifth to eighth bit line structures 64a, 64b, 64c and 64d may have tip portions 64a1, 64a2, 64b1, 64b2, 64c1, 64c2, 64d1 and 64d2 protruding toward the third and fourth channel layers 430 and 440.

The protruding tip portions 62a1, 62a2, 62b1, 62b2, 62c1, 62c2, 62d1, 62d2, 64a1, 64a2, 64b1, 64b2, 64c1, 64c2, 64d1 and 64d2 of the first to eighth bit line structures 62a, 62b, 62c, 62d, 64a, 64b, 64c, and 64d may allow an electric field to be concentrated on the protruding tip portions 62a1, 62a2, 62b1, 62b2, 62c1, 62c2, 62d1, 62d2, 64a1, 64a2, 64b1, 64b2, 64c1, 64c2, 64d1 and 64d2 when a voltage is applied to the first to eighth bit line structures 62a, 62b, 62c, 62d, 64a, 64b, 64c, and 64d. With a concentrated electric field, a resistance change operation inside the first and second resistance change structures 22 and 24 may occur more effectively or efficiently. For example, conductive filaments may be preferentially generated or the generated conductive filaments may effectively be disconnected by an electric field concentration effect inside the first and second resistance change structures 22 and 24. In another example, nucleation of the insulation layer may occur preferentially within the first and second resistance change structures 22 and 24 where the electric field is concentrated, or removal of the insulation layer may occur preferentially. Thus, it is possible to effectively write and store signal information via the resistance change.

In some other embodiments not illustrated, a configuration including the first to eighth bit line structures 62a, 62b, 62c, 62d, 64a, 64b, 64c, and 64d having the tip portions protruding toward the first to fourth channel layers 410, 420, 430 and 440 may be used in a nonvolatile memory device 1 (described above with reference to FIGS. 1 to 3), which does not have the first to tenth cell insulation structures 50a, 50b, 50c, 50d, 50e, 50f, 50g, 50h, 50i and 50j.

Figure 10:
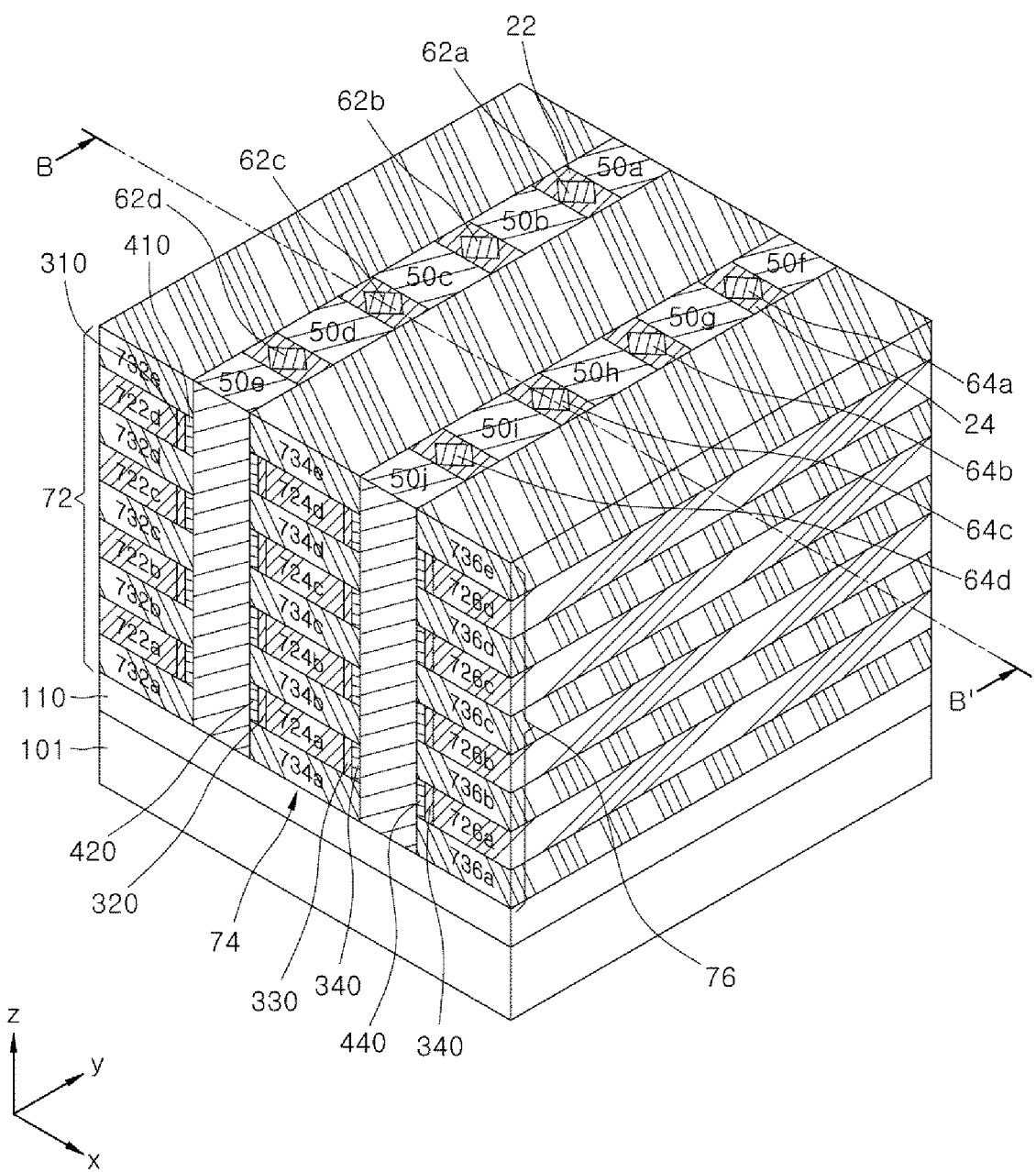
FIG. 10 is a perspective view schematically illustrating a nonvolatile memory device according to still yet another embodiment of the present disclosure.
Figure 11:
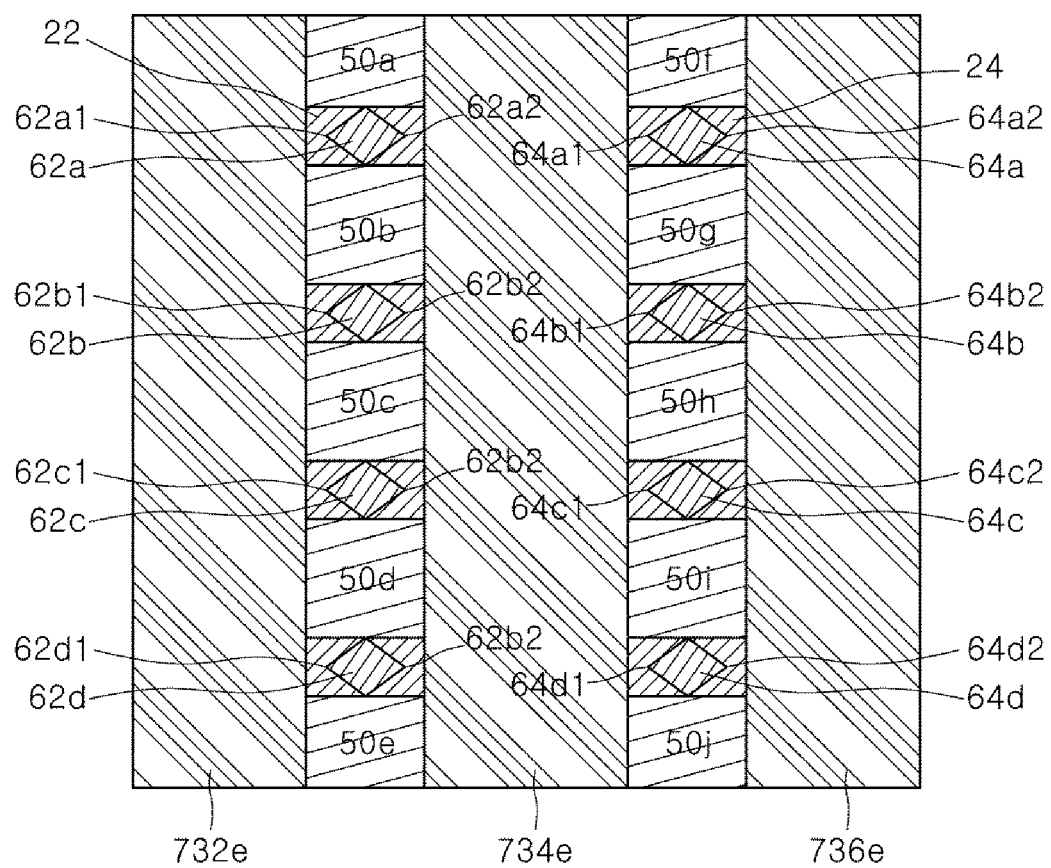
FIG. 11 is a plan view of the nonvolatile memory device of FIG. 10.
Figure 12:
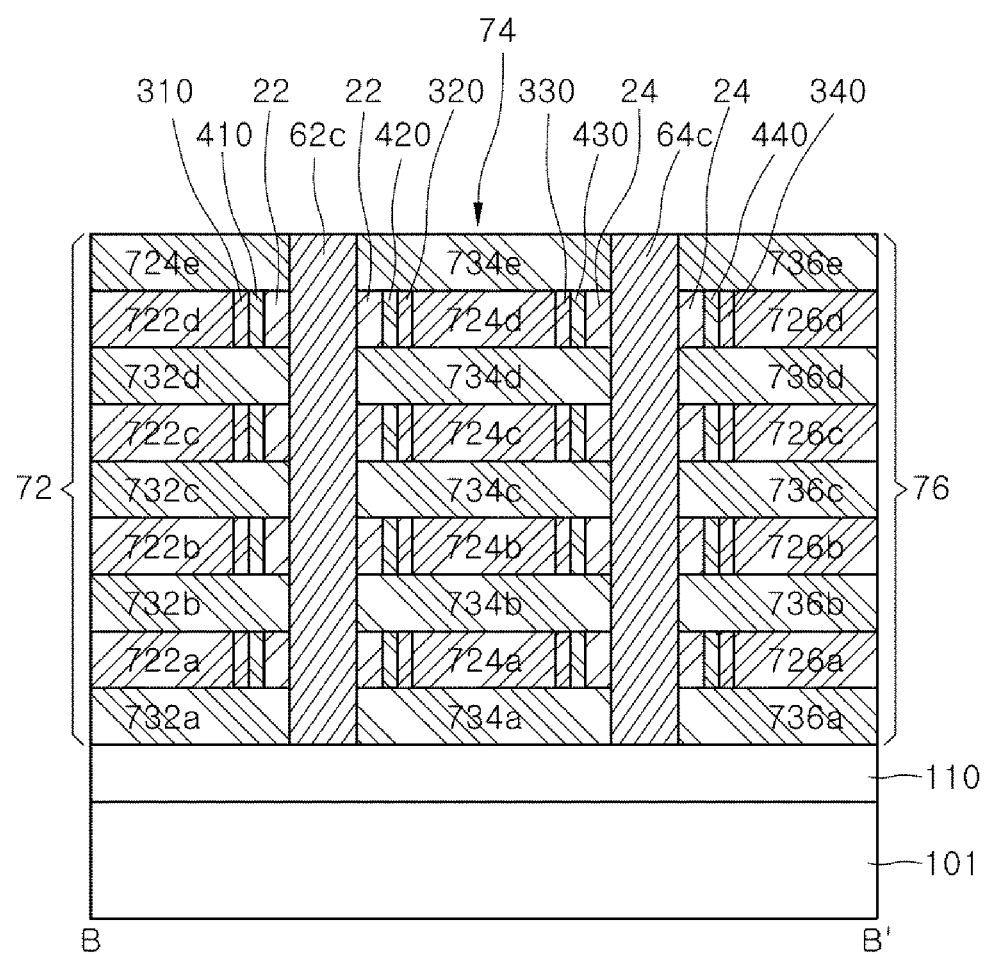
FIG. 12 is a cross-sectional view taken along the line B-B' of the nonvolatile memory device of FIG. 10.
Figure 12:
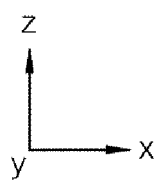

FIG. 10 is a perspective view illustrating a nonvolatile memory device according to still yet another embodiment of the present disclosure. FIG. 11 is a plan view of the nonvolatile memory device of FIG. 10. FIG. 12 is a cross-sectional view taken along the line B-B' of the nonvolatile memory device of FIG. 10.

Referring to FIGS. 10 to 12, in comparison with the nonvolatile memory device 4 described above with reference FIGS. 8 and 9, the nonvolatile memory device 5 may be different in the configuration of the first to third gate electrode structures 72, 74 and 76.

In an embodiment, the first gate electrode structure 72 may include first to fourth gate electrode layer patterns 722a, 722b, 722c and 722d and first to fifth gate insulation layer patterns 732a, 732b, 732c, 732d and 732e, which are alternately stacked in a first direction (i.e., the z-direction). The second gate electrode structure 74 may include first to fourth gate electrode layer patterns 724a, 724b, 724c and 724d and first to fifth gate insulation layer patterns 734a, 734b, 734c, 734d and 734e, which are alternately stacked in the first direction (i.e., the z-direction). The third gate electrode structure 76 may include first to fourth gate electrode layer patterns 726a, 726b, 726c and 726d and first to fifth gate insulation layer patterns 736a, 736b, 736c, 736d and 736e, which are alternately stacked in the first direction (i.e., the z-direction).

Referring to FIGS. 10 and 12, the first to fifth gate insulation layer patterns 732a, 732b, 732c, 732d and 732e of the first gate electrode structure 72 may separate a first gate dielectric layer 310 and a first channel layer 410 with respect to the first direction (i.e., the z-direction). Accordingly, the first to fourth gate electrode layer patterns 722a, 722b, 722c and 722d may be disposed to contact the first gate dielectric layer 310 in a third direction (i.e., the x-direction). The first to fifth gate insulation layer patterns 732a, 732b, 732c, 732d and 732e may be disposed to contact first to fifth cell insulation structures 50a, 50b, 50c, 50d and 50e and a first resistance change structure 22 in the third direction (i.e., the x-direction).

Similarly, the first to fifth gate insulation layer patterns 734a, 734b, 734c, 734d and 734e of the second gate electrode structure 74 may separate the second and third gate dielectric layers 320 and 330, and the second and third channel layers 420 and 430 with respect to the first direction (i.e., the z-direction). Accordingly, the first to fourth gate electrode layer patterns 724a, 724b, 724c and 724d may be disposed to contact the second and third gate dielectric layers 320 and 330. First to fifth gate insulation layer patterns 734a, 734b, 734c, 734d and 734e of the second gate electrode structure 74 may be disposed to contact the first to tenth cell insulation structures 50a, 50b, 50c, 50d, 50e, 50f, 50g, 50h, 50i and 50j and the first and second resistance change structures 22 and 24 in the third direction (i.e., the x-direction), respectively.

Similarly, the first to fifth gate insulation layer patterns 736a, 736b, 736c, 736d and 736e of the third gate electrode structure 76 may separate the fourth gate dielectric layer 340 and the fourth channel layer 440 with respect to the first direction (i.e., the z-direction). Accordingly, the first to fourth gate electrode layer patterns 726a, 726b, 726c and 726d may be disposed to contact the fourth gate dielectric layer 340 in the third direction (i.e., the x-direction). The first to fifth gate insulation layer patterns 736a, 736b, 736c, 736d and 736e the third gate electrode structure 76 may be disposed to contact the sixth to tenth cell insulation structures 50f, 50g, 50h, 50i and 50j and the second resistance change structure 24 in the third direction (i.e., the x-direction).

In some other embodiments not illustrated, a configuration of the first to third gate electrode structures 72, 74 and 76 of the embodiments may use in the nonvolatile memory device 1 described above with reference to FIGS. 1 to 3, and to the nonvolatile memory device 3 described above with reference to FIGS. 6 and 7.

As described above, according to embodiments of the present disclosure, a gate electrode structure, a gate dielectric layer, a channel layer, a resistance change structure, and a bit line structure are three-dimensionally disposed on a substrate to effectively implement a nonvolatile memory device having a randomly accessible memory cell.

The embodiments of the inventive concept have been disclosed above for illustrative purposes. Those of ordinary skill in the art will appreciate that various modifications, additions and substitutions are possible, without departing from the scope and spirit of the inventive concept as disclosed in the accompanying claims.

What is claimed is:
1. A nonvolatile memory device comprising:
a substrate;
a gate electrode structure disposed on the substrate, the gate electrode structure comprising at least one gate electrode layer pattern and at least one gate insulation layer pattern that are alternately stacked in a first direction perpendicular to the substrate, wherein the gate electrode structure extends in a second direction perpendicular to the first direction;

a gate dielectric layer covering at least a portion of a sidewall surface of the gate electrode structure on the substrate, the sidewall surface of the gate electrode structure being a plane formed by the first and second directions;

a channel layer and a resistance change structure that are sequentially disposed on the gate dielectric layer in a third direction perpendicular to the first and second directions; and a plurality of bit line structures extending in the first direction within the resistance change structure and spaced apart from each other in the second direction, wherein the plurality of bit line structures are disposed to be spaced apart from the channel layer with respect to the third direction.

2. The nonvolatile memory device of claim 1, wherein each of the plurality of bit line structures has a pillar shape.

3. The nonvolatile memory device of claim 2, wherein each of the plurality of bit line structures has a tip portion protruding toward the channel layer.

4. The nonvolatile memory device of claim 1, wherein the resistance change structure comprises oxide having oxygen vacancies.

5. The nonvolatile memory device of claim 4, wherein the oxide includes at least one oxide material selected from the group consisting of silicon oxide, aluminum oxide, tantalum oxide, titanium oxide, and hafnium oxide.

6. The nonvolatile memory device of claim 1, wherein the channel layer comprises at least one of doped semiconductor, metal oxide, and transition metal di-chalcogenide (TMDC).

7. The nonvolatile memory device of claim 1, wherein the gate electrode layer pattern comprises at least one selected from the group consisting of doped semiconductor, metal, conductive metal nitride, conductive metal carbide, conductive metal silicide, and conductive metal oxide.

8. The nonvolatile memory device of claim 1, further comprising:

a source line disposed at an end of the channel layer and electrically connected to the channel layer.

9. The nonvolatile memory device of claim 1, wherein the gate dielectric layer is disposed to contact a sidewall surface of the gate electrode layer pattern and a sidewall surface of the gate insulation layer pattern.

10. The nonvolatile memory device of claim 1, wherein the gate insulation layer pattern separates the gate dielectric layer, the channel layer and the resistance change structure with respect to the first direction.

11. The nonvolatile memory device of claim 10, wherein the gate electrode layer pattern is disposed to contact the gate dielectric layer in the third direction, and wherein the gate insulation layer pattern is disposed to contact the bit line structures in the third direction.

12. The nonvolatile memory device of claim 1, further comprising:

a cell insulation structure disposed to extend in the first direction and disposed between the plurality of bit line structures in the second direction.

13. The nonvolatile memory device of claim 12, wherein the cell insulation structure separates the resistance change structure in the second direction.

14. A nonvolatile memory device comprising:

a substrate;

a pair of gate electrode structures disposed to be spaced apart from each other on the substrate, each of the pair of gate electrode structures comprising at least one gate electrode layer pattern and at least one gate insulation layer pattern that are alternately stacked in a first direction perpendicular to the substrate, wherein each of the pair of gate electrode structures extends in a second direction perpendicular to the first direction;

gate dielectric layers and channel layers that are sequentially disposed on respective a sidewall surface of the pair of gate electrode structures in a third direction perpendicular to the first and second directions;

a resistance change structure disposed between the pair of gate electrode structures on the substrate and disposed to contact the pair of channel layers; and a plurality of bit line structures extending in the first direction within the resistance change structure and spaced apart from each other in the second direction.

15. The nonvolatile memory device of claim 14, wherein the plurality of bit line structures are disposed to be spaced apart from the pair of channel layers with respect to the third direction.

16. The nonvolatile memory device of claim 14, wherein each of the plurality of bit line structures has a pillar shape.

17. The nonvolatile memory device of claim 14, wherein each of the plurality of bit line structures has a tip portion protruding toward the pair of channel layers.

18. The nonvolatile memory device of claim 14, wherein the gate dielectric layer is disposed to contact the sidewall surface of the gate electrode layer pattern and a sidewall surface of the gate insulation layer pattern.

19. The nonvolatile memory device of claim 14, wherein the gate insulation layer pattern separates the gate dielectric layer, the channel layers and the resistance change structure with respect to the first direction.

20. The nonvolatile memory device of claim 14, further comprising:

a cell insulation structure disposed to extend in the first direction and disposed between the plurality of bit line structures in the second direction.

* * * * *